(12) United States Patent
Lee et al.

(10) Patent No.: US 10,453,837 B2
(45) Date of Patent: Oct. 22, 2019

(54) SYSTEM AND METHOD OF FABRICATING ESD FINFET WITH IMPROVED METAL LANDING IN THE DRAIN

(71) Applicant: Taiwan Semiconductor Manufacturing Co., Ltd., Hsinchu (TW)

(72) Inventors: Tzung-Chi Lee, Taipei County (TW); Tung-Heng Hsieh, Hsinchu County (TW); Bao-Ru Young, Hsinchu County (TW); Yung Feng Chang, Hsinchu County (TW)

(73) Assignee: TAIWAN SEMICONDUCTOR MANUFACTURING CO., LTD., Hsin-Chu (TW)

(*) Notice: Subject to any disclaimer, the term of this patent is extended or adjusted under 35 U.S.C. 154(b) by 0 days.

(21) Appl. No.: 16/396,447

(22) Filed: Apr. 26, 2019

(65) Prior Publication Data

US 2019/0252370 A1    Aug. 15, 2019

Related U.S. Application Data

(60) Continuation of application No. 15/863,536, filed on Jan. 5, 2018, now Pat. No. 10,276,559, which is a
(Continued)

(51) Int. Cl.
*H01L 27/02* (2006.01)
*H01L 29/66* (2006.01)
(Continued)

(52) U.S. Cl.
CPC ...... *H01L 27/0266* (2013.01); *G06F 17/5072* (2013.01); *H01L 21/266* (2013.01); *H01L 21/31155* (2013.01); *H01L 29/0649* (2013.01); *H01L 29/0847* (2013.01); *H01L 29/6656* (2013.01); *H01L 29/66659* (2013.01);
(Continued)

(58) Field of Classification Search
CPC ............... H01L 27/0266; H01L 21/266; H01L 21/31155
See application file for complete search history.

(56) References Cited

U.S. PATENT DOCUMENTS 7,425,740 B2    9/2008  Liu et al.
7,667,271 B2    2/2010  Yu et al.
(Continued)

FOREIGN PATENT DOCUMENTS

KR    20130014041 A    2/2013
KR    20160065747 A    6/2016
TW       201613094 A    4/2016

*Primary Examiner* — Errol V Fernandes
(74) *Attorney, Agent, or Firm* — Haynes and Boone, LLP

(57) ABSTRACT

A mandrel is formed over an active region that includes a first region and a second region. The first region and the second region are reserved for the formation of a source and a drain of a FinFET, respectively. A portion of the mandrel formed over the second region is broken up into a first segment and a second segment separated from the first segment by a gap. Spacers are formed on opposite sides of the mandrel. Using the spacers, fins are defined. The fins protrude upwardly out of the active region. A portion of the second region corresponding to the gap has no fins formed thereover. The source is epitaxially grown on the fins in the first region. At least a portion of the drain is epitaxially grown on the portion of the second region having no fins.

20 Claims, 16 Drawing Sheets

Related U.S. Application Data division of application No. 15/339,282, filed on Oct. 31, 2016, now Pat. No. 9,865,589.

(51) Int. Cl.

| | | |
|---|---|---|
| *H01L 29/78* | (2006.01) | |
| *H01L 29/06* | (2006.01) | |
| *G06F 17/50* | (2006.01) | |
| *H01L 21/3115* | (2006.01) | |
| *H01L 21/266* | (2006.01) | |
| *H01L 29/08* | (2006.01) | |

(52) U.S. Cl.
CPC .... *H01L 29/66795* (2013.01); *H01L 29/7835* (2013.01); *H01L 29/7851* (2013.01)

(56) References Cited

U.S. PATENT DOCUMENTS

| | | | |
|---|---|---|---|
| 7,910,453 | B2 | 3/2011 | Xu et al. |
| 8,048,723 | B2 | 11/2011 | Chang et al. |
| 8,053,299 | B2 | 11/2011 | Xu |
| 8,183,627 | B2 | 5/2012 | Currie |
| 8,362,575 | B2 | 1/2013 | Kwok et al. |
| 8,367,498 | B2 | 2/2013 | Chang et al. |
| 8,377,779 | B1 | 2/2013 | Wang |
| 8,399,931 | B2 | 3/2013 | Liaw et al. |
| 8,415,718 | B2 | 4/2013 | Xu |
| 8,440,517 | B2 | 5/2013 | Lin et al. |
| 8,487,378 | B2 | 7/2013 | Goto et al. |
| 8,497,177 | B1 | 7/2013 | Chang et al. |
| 8,497,528 | B2 | 7/2013 | Lee et al. |
| 8,609,518 | B2 | 12/2013 | Wann et al. |
| 8,610,240 | B2 | 12/2013 | Lee et al. |
| 8,618,556 | B2 | 12/2013 | Wu et al. |
| 8,633,516 | B1 | 1/2014 | Wu et al. |
| 8,652,894 | B2 | 2/2014 | Lin et al. |
| 8,680,576 | B2 | 3/2014 | Ching et al. |
| 8,686,516 | B2 | 4/2014 | Chen et al. |
| 8,703,565 | B2 | 4/2014 | Chang et al. |
| 8,716,765 | B2 | 5/2014 | Wu et al. |
| 8,723,272 | B2 | 5/2014 | Liu et al. |
| 8,729,627 | B2 | 5/2014 | Cheng et al. |
| 8,729,634 | B2 | 5/2014 | Shen et al. |
| 8,735,993 | B2 | 5/2014 | Lo et al. |
| 8,736,056 | B2 | 5/2014 | Lee et al. |
| 8,742,509 | B2 | 6/2014 | Lee et al. |
| 8,772,109 | B2 | 7/2014 | Colinge |
| 8,776,734 | B1 | 7/2014 | Roy et al. |
| 8,785,285 | B2 | 7/2014 | Tsai et al. |
| 8,796,666 | B1 | 8/2014 | Huang et al. |
| 8,796,759 | B2 | 8/2014 | Perng et al. |
| 8,809,139 | B2 | 8/2014 | Huang et al. |
| 8,815,712 | B2 | 8/2014 | Wan et al. |
| 8,816,444 | B2 | 8/2014 | Wann et al. |
| 8,823,065 | B2 | 9/2014 | Wang et al. |
| 8,826,213 | B1 | 9/2014 | Ho et al. |
| 8,828,823 | B2 | 9/2014 | Liu et al. |
| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |
| 8,860,148 | B2 | 10/2014 | Hu et al. |
| 8,871,584 | B2 | 10/2014 | Tang et al. |
| 8,887,106 | B2 | 11/2014 | Ho et al. |
| 9,105,490 | B2 | 8/2015 | Wang et al. |
| 9,276,088 | B1 | 3/2016 | Singh |
| 9,368,484 | B1 | 6/2016 | Chen et al. |
| 2008/0073667 | A1 | 3/2008 | Lochtefeld |
| 2011/0068407 | A1 | 3/2011 | Yeh et al. |
| 2013/0011983 | A1 | 1/2013 | Tsai et al. |
| 2013/0285153 | A1 | 10/2013 | Lee et al. |
| 2014/0001574 | A1 | 1/2014 | Chen et al. |
| 2014/0092506 | A1 | 4/2014 | Ahsan et al. |
| 2014/0110755 | A1 | 4/2014 | Colinge |
| 2014/0151812 | A1 | 6/2014 | Liaw |
| 2014/0183600 | A1 | 7/2014 | Huang et al. |
| 2014/0252412 | A1 | 9/2014 | Tsai et al. |
| 2014/0264590 | A1 | 9/2014 | Yu et al. |
| 2014/0264592 | A1 | 9/2014 | Oxland et al. |
| 2014/0282326 | A1 | 9/2014 | Chen et al. |
| 2015/0031181 | A1 | 1/2015 | Tang et al. |
| 2015/0263003 | A1 | 9/2015 | Lee et al. |
| 2015/0311342 | A1 | 10/2015 | Lin et al. |
| 2016/0155670 | A1 | 6/2016 | Liaw |
| 2017/0053912 | A1 | 2/2017 | Ching et al. |

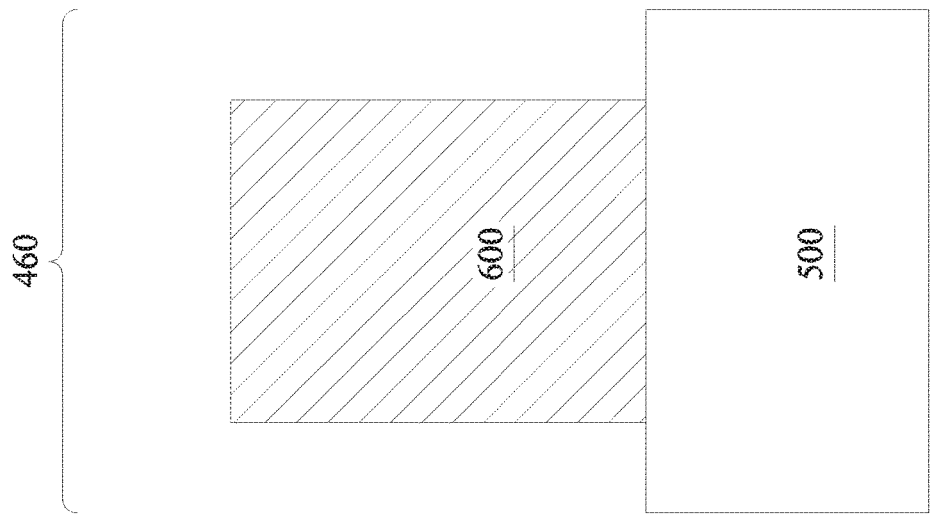
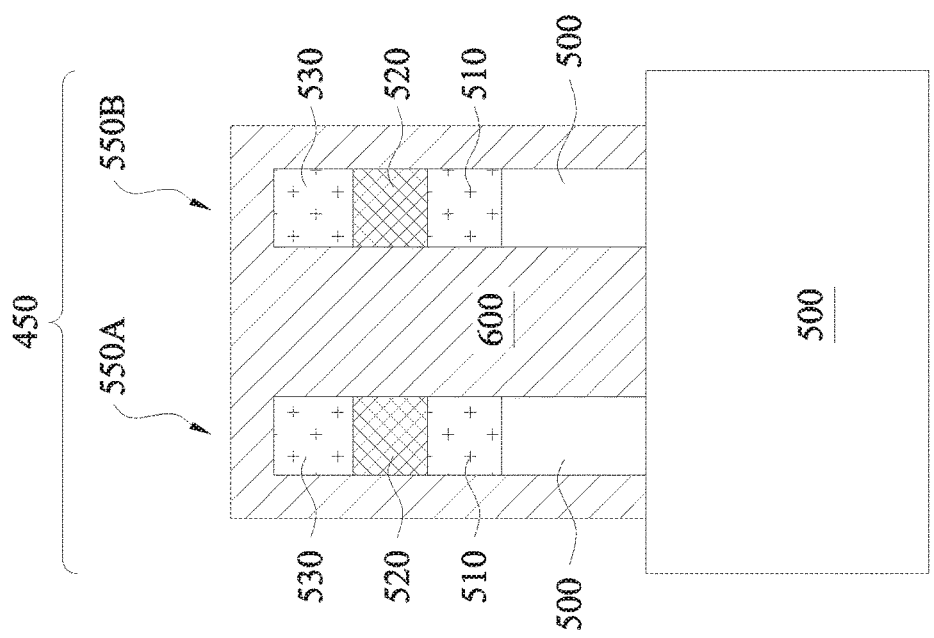
Fig. 7B
Fig. 7A

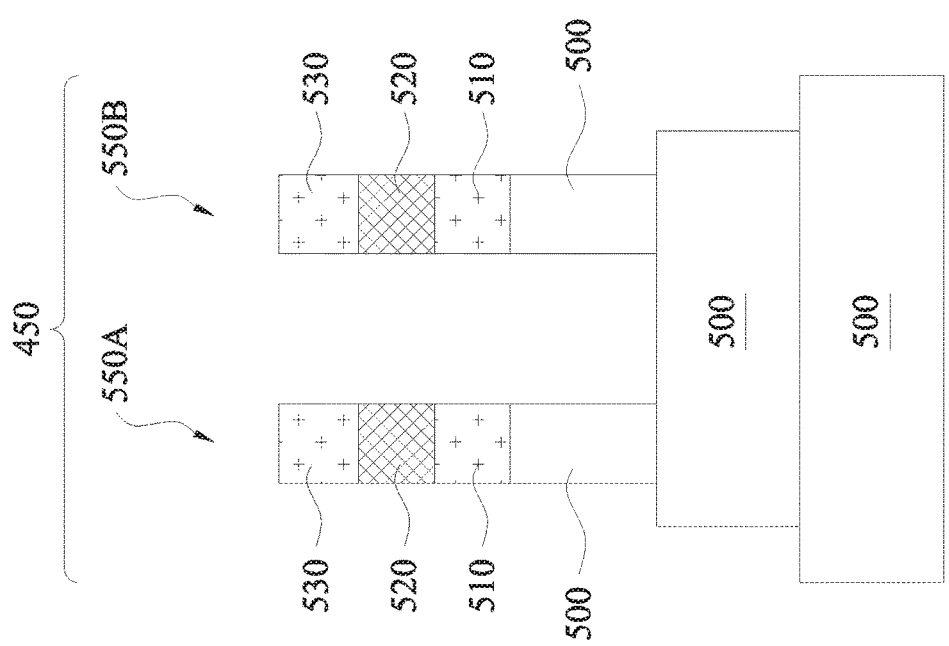

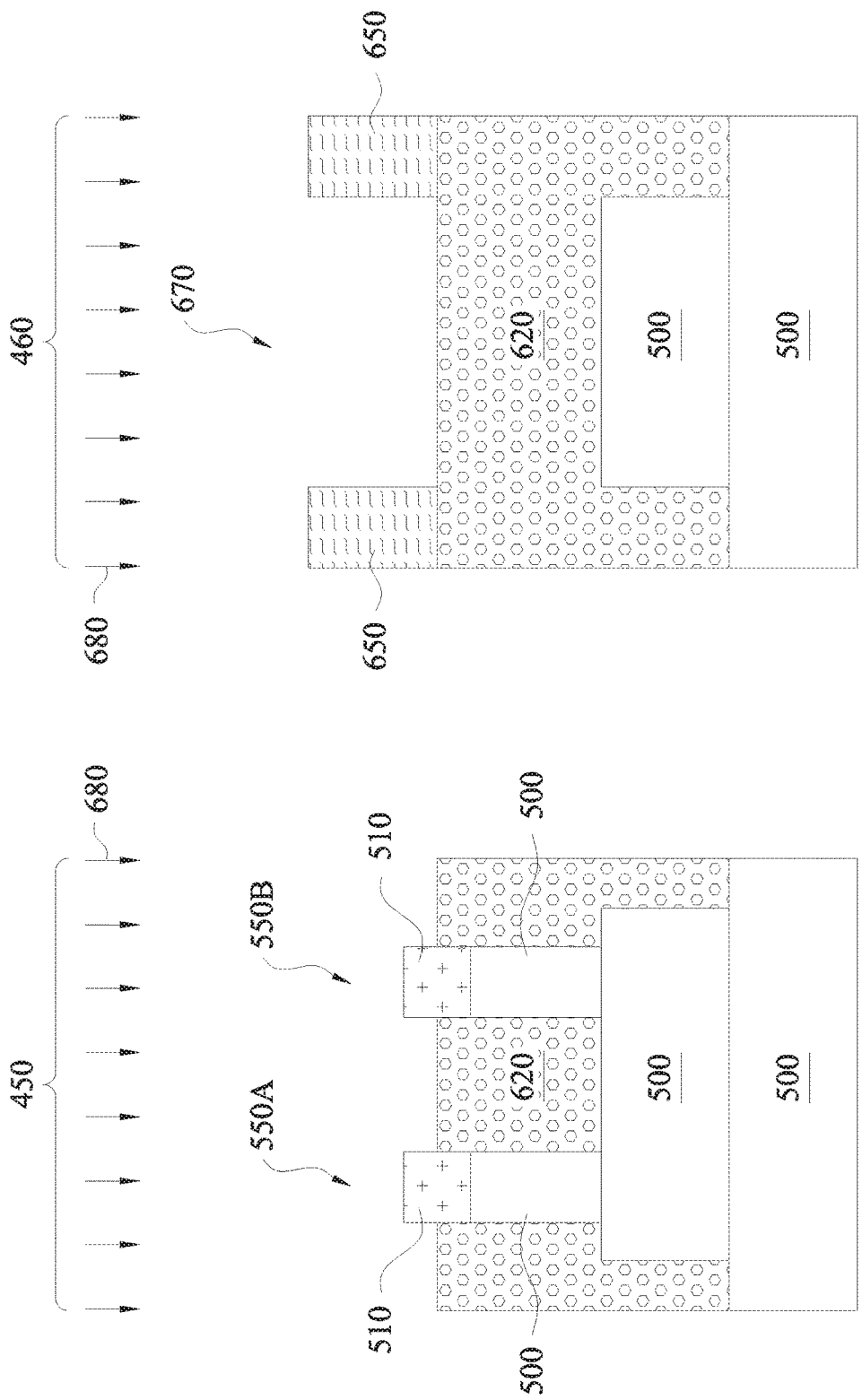

SYSTEM AND METHOD OF FABRICATING ESD FINFET WITH IMPROVED METAL LANDING IN THE DRAIN

PRIORITY DATA

The present application is a continuation of U.S. patent application Ser. No. 15/863,536, filed Jan. 5, 2018, which is a divisional of U.S. patent application Ser. No. 15/339,282, filed Oct. 31, 2016, now U.S. Pat. No. 9,865,589, the disclosures of which are hereby incorporated by reference in their entirety.

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) device. A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow.

However, conventional FinFET devices may still have certain drawbacks. One drawback is that, for FinFET devices that are used for electrostatic discharge (ESD) protection, the drain region is substantially wider than the source region (and wider than drain regions of other non-ESD type of FinFET devices. The longer drain site may lead to poor epitaxial growth, which may cause metal contact landing problems. For example, the metal contact that is supposed to be formed on the ESD drain site may actually have connection problems with the ESD drain site. The poor connection between the ESD drain site and the metal contact consequently degrades device performance and may even lead to device failures.

Therefore, while existing FinFET devices and the fabrication thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4A-10A, 12A-15A, 4B-10B, 12B-15B are different cross-sectional side views of a FinFET device according to various embodiments of the present disclosure

DETAILED DESCRIPTION

Figure 1:
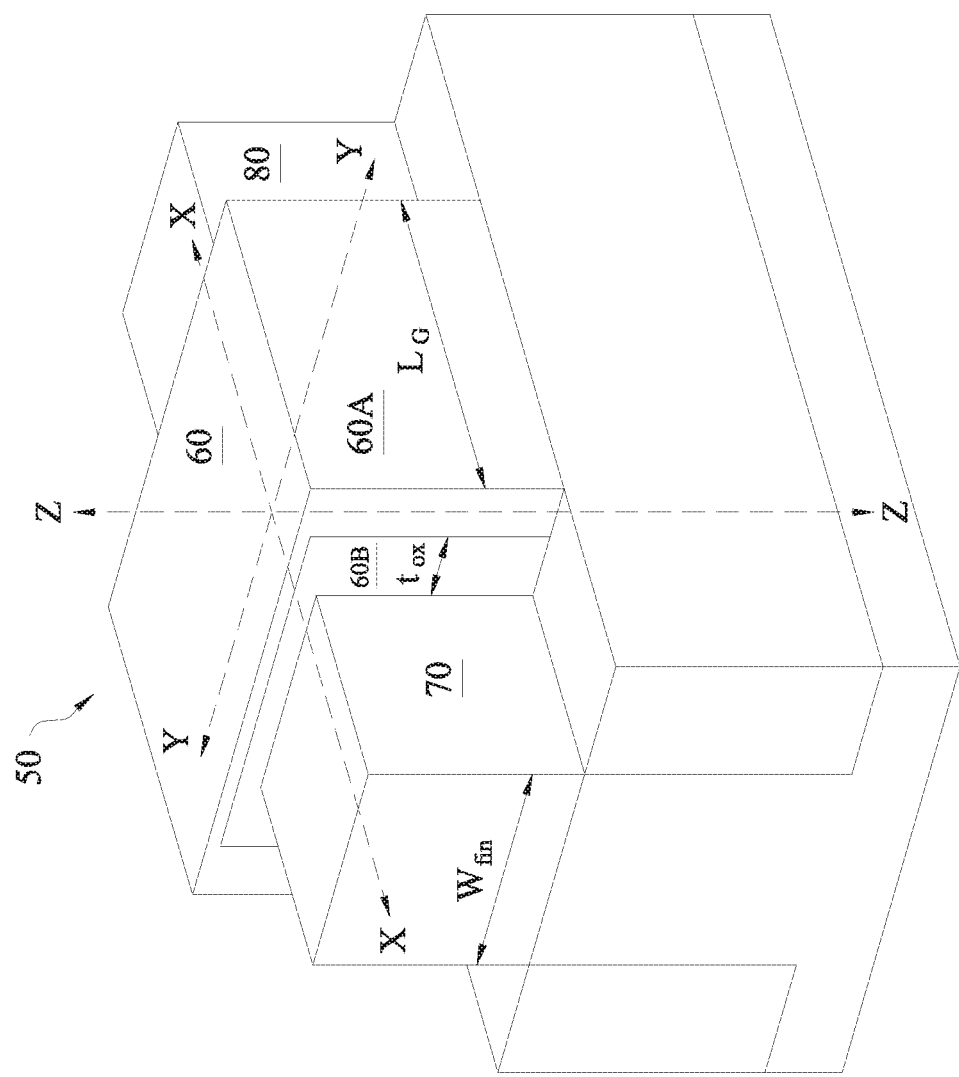
FIG. 1 is a perspective view of an example FinFET device.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The use of FinFET devices has been gaining popularity in the semiconductor industry. Referring to FIG. 1, a perspective view of an example FinFET device 50 is illustrated. The FinFET device 50 is a non-planar multi-gate transistor that is built over a substrate (such as a bulk substrate). A thin silicon "fin-like" structure (referred to as fin) forms the body of the FinFET device 50. The fin has a fin width $W_{fin}$. A gate 60 of the FinFET device 50 is wrapped around this fin. Lg denotes a length (or width, depending on the perspective) of the gate 60. The gate 60 may include a gate electrode component 60A and a gate dielectric component 60B. The gate dielectric 60B has a thickness $t_{ox}$. A portion of the gate 60 is located over a dielectric isolation structure such as shallow trench isolation (STI). A source 70 and a drain 80 of the FinFET device 50 are formed in extensions of the fin on opposite sides of the gate 60. The fin itself serves as a channel. The effective channel length of the FinFET device 50 is determined by the dimensions of the fin.

FinFET devices offer several advantages over traditional Metal-Oxide Semiconductor Field Effect Transistor (MOSFET) devices (also referred to as planar devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, traditional FinFET fabrication methods may still have shortcomings. For example, FinFET devices may be used for electrostatic discharge (ESD) protection. The ESD FinFET devices may have different physical characteristics than non-ESD FinFET devices. For example, a non-ESD FinFET device may have a source region and a drain region that are not that different from one another in terms of their dimensions. However, for ESD FinFET devices, the drain region (also interchangeably referred to as a drain site or drain component) may be substantially longer than the source region. In various embodiments, the drain region of ESD FinFET devices may be at least two times (or even three times or more) wider than the source region. This also means that the drain region of ESD FinFET devices may be substantially wider than the drain region of non-ESD FinFET devices as well. The longer drain region is configured to facilitate the dissipation of the electrostatic discharge, and as such, it is one of the unique features of ESD devices.

However, conventional methods of fabricating ESD FinFET devices may lead to poor epitaxial growth for this longer drain region. The poor epitaxial growth may cause "metal landing" problems. For example, a metal contact that is supposed to be formed on the drain region of the ESD FinFET device (so as to electrically couple the drain of the ESD FinFET device to other microelectronic components) may not make good physical (or electrical) contact with the epitaxially grown drain region. In some cases, the metal contact may make physical contact with some parts of the epitaxially grown drain region. In other cases, the metal contact may not even make physical contact with the epitaxially grown drain region at all. These poor "metal landing" problems may degrade device performance (e.g., transistor drain current) and may even lead to device failures. Furthermore, as semiconductor device sizes continue to get scaled down, these problems described above may be exacerbated.

To improve device performance and yield, the present disclosure utilizes various fabrication techniques to fabricate ESD FinFET devices with improved "metal landing", as discussed in more detail below with reference to FIGS. 2-16.

Figure 2:
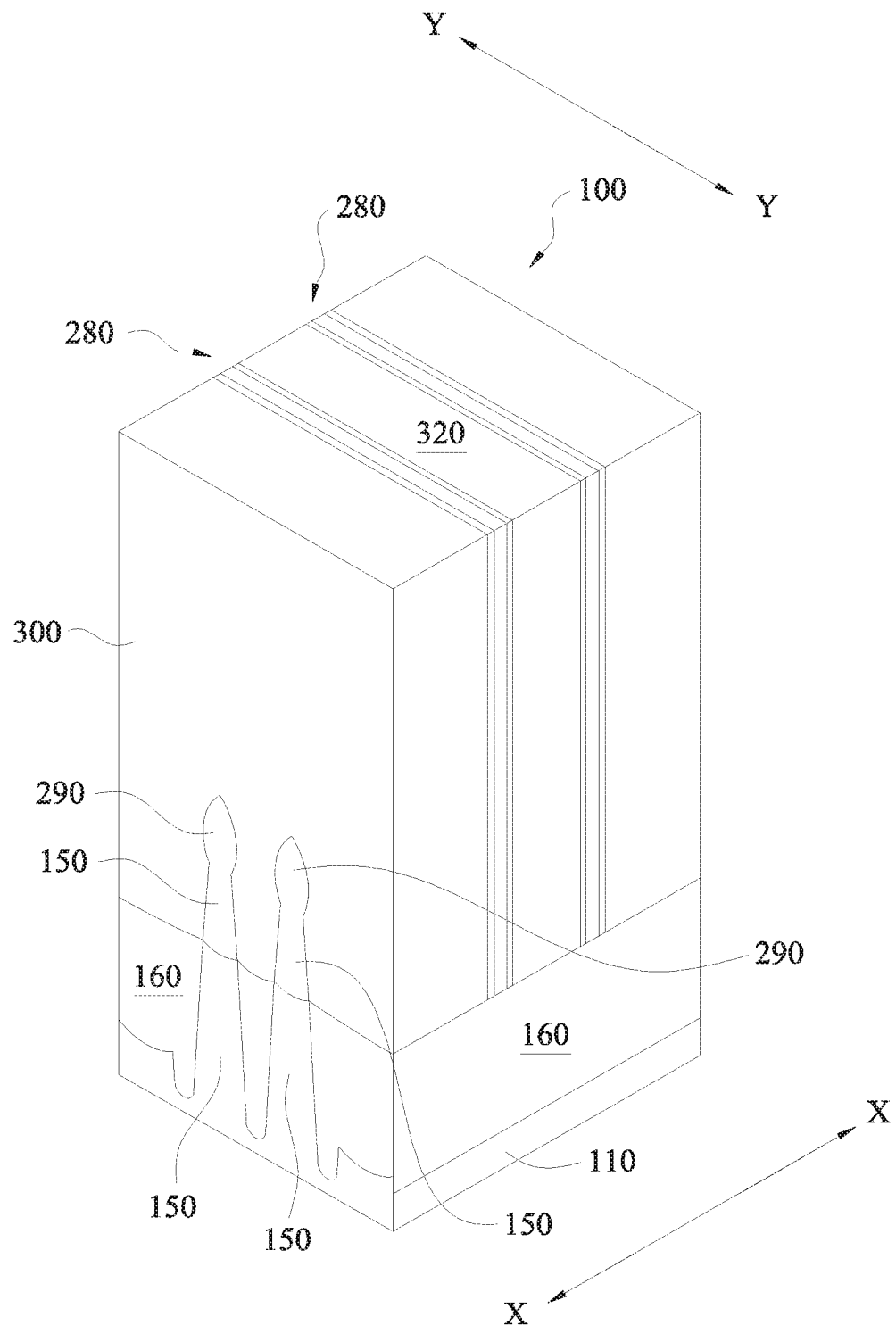
FIG. 2 is a perspective three-dimensional view of a FinFET device according to various embodiments of the present disclosure.

FIG. 2 is a three-dimensional perspective view of a FinFET device 100. The FinFET device 100 is fabricated over a substrate, which is not specifically illustrated herein for reasons of simplicity. In some embodiments, the substrate includes a dielectric material, for example silicon oxide ($SiO_2$). Other suitable materials may also be used for the substrate in alternative embodiments.

The FinFET device 100 includes a semiconductor layer 110. In an embodiment, the semiconductor layer 110 includes a crystal silicon material. An implantation process (e.g., an anti-punch-through implantation process) may be performed to implant a plurality of dopant ions to the semiconductor layer 110. The dopant ions may include an n-type material in some embodiments, for example arsenic (As) or phosphorous (P), or they may include a p-type material in some other embodiments, for example boron (B), depending on whether an NMOS or a PMOS is needed. Dielectric isolation structures 160 such as shallow trench isolation (STI) are formed over the semiconductor layer 110.

The FinFET device 100 includes fin structures 150 that partially protrude upwards and out of the isolation structures 160. In other words, at least a portion of each fin structure 150 is not covered by the isolation structures 160. Source/drain epi regions 290 are formed on the fin structures 150. In some embodiments, the source/drain epi regions 290 have a diamond-like cross-sectional profile.

Interlayer dielectric (ILD) 300 is formed over the isolation structures 160 and over the fin structures 150 and the source/drain epi regions 290. In some embodiments, the ILD 300 contains silicon oxide. The ILD 300 may be formed by a suitable deposition process followed by a polishing process such as chemical-mechanical-polishing (CMP), so as to planarize the upper surface of the ILD 300.

A functional gate structure 320 is formed to wrap around the fin structures 150 and the source/drain epi regions 290. In some embodiments, the functional gate structure 320 includes a high-k gate dielectric and a metal gate electrode. A high-k dielectric material is a material having a dielectric constant that is greater than a dielectric constant of $SiO_2$, which is approximately 4. In an embodiment, the high-k gate dielectric includes hafnium oxide ($HfO_2$), which has a dielectric constant that is in a range from approximately 18 to approximately 40. In alternative embodiments, the high-k gate dielectric may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, or SrTiO. The metal gate electrode may include a work function metal component and a fill metal component. The work functional metal component is configured to tune a work function of its corresponding FinFET to achieve a desired threshold voltage Vt. In various embodiments, the work function metal component may contain: TiAl, TiAlN, TaCN, TiN, WN, or W, or combinations thereof. The fill metal component is configured to serve as the main conductive portion of the functional gate structure 320. In various embodiments, the fill metal component may contain Aluminum (Al), Tungsten (W), Copper (Cu), or combinations thereof. In some embodiments, the gate structures 320 may be formed by a gate replacement process in which a dummy gate structure is replaced by the functional gate structure 320. The gate structure 320 may also be surrounded on the sides by spacers 280. The fabrication processes used to form the FinFET device 100 are discussed in more detail in U.S. patent application Ser. No. 15/261,302, filed on Sep. 9, 2016, entitled "System and Method for Widening Fin Widths for Small Pitch FinFET Devices", the disclosure of which is hereby incorporated by reference in its entirety.

Since the FinFET device 100 shown in FIG. 2 is a three-dimensional structure, different two-dimensional cross-sectional views may be obtained by slicing or cutting the FinFET device 100 in either an X-direction or a Y-direction (the X and Y directions are illustrated in FIG. 2), also referred to as an X-cut or a Y-cut, respectively. The X-direction and the Y-direction are perpendicular to each other. Various two-dimensional cross-sectional views along the X-cut or the Y-cut will be discussed in more detail below.

As discussed above, for FinFET devices, the epi regions 290 may be used as a source component or a drain component of a FinFET transistor. For example, the epi region 290 disposed on one side of a FinFET transistor may be a source component, and the epi region 290 disposed on an opposite side of the FinFET transistor may be a drain component. For some FinFET devices, the source component and the drain component may be somewhat symmetrical, for example they may have substantially similar sizes or dimensions. However, for ESD FinFET devices, the source/drain symmetry may not exist. For example, a drain component of an ESD FinFET device may be substantially longer (e.g., longer in the X-direction shown in FIG. 2) than the source component. The longer drain may help facilitate the dissipation of electrostatic charges. However, the longer drain of ESD FinFET devices may also lead to poor epitaxial growth, which may adversely affect the metal contact landing on the drain.

Figure 3:
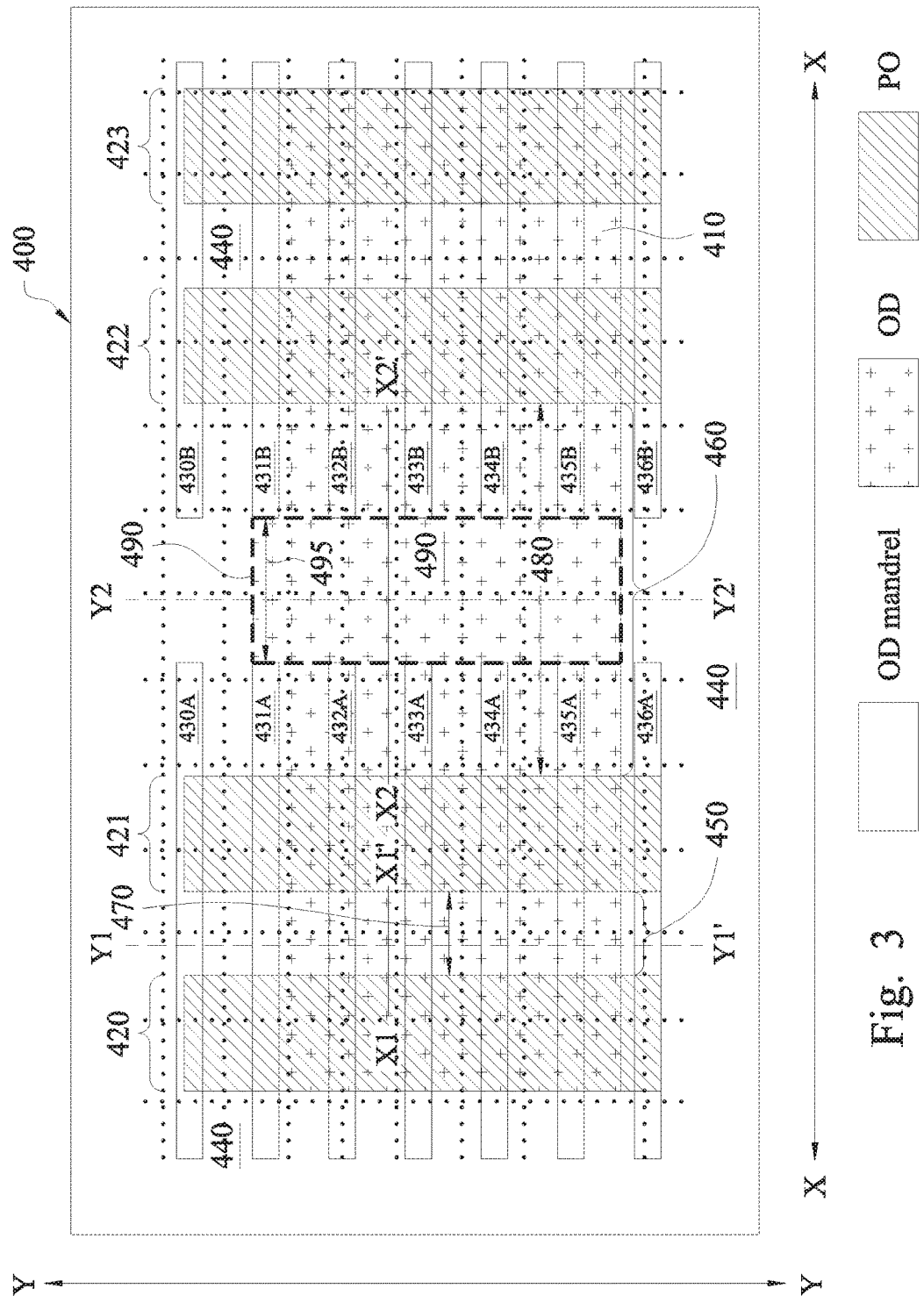
FIG. 3 is a top view of a FinFET device according to embodiments of the present disclosure.

The present disclosure implements certain layout and process modifications to avert the poor epitaxial growth problem associated with the longer drain. Referring to FIG. 3, a top view of a portion of an IC layout 400 is illustrated. The portion of the IC layout 400 shows, among other things, an active region (OD) 410, example polysilicon regions (PO) 420, 421, 422, and 423, and example OD mandrels 430A/B, 431A/B, 432A/B, 433A/B, 434A/B, 435A/B, and 436A/B. The active region 410, the polysilicon regions 420-423, and the OD mandrels 430A/B to 436A/B are surrounded (in the top view) by a dielectric isolation structure such as a shallow trench isolation (STI) 440. The X-direction and the Y-direction (shown in FIG. 2) are also illustrated in the top view of FIG. 3, so as to help the reader orient or associate the 3D view of FIG. 2 with the top view of FIG. 3.

The active region 410 is the region where the source or drain of a transistor (such as the FinFET device 100 discussed above) will be formed. The polysilicon regions 420-423 are where the dummy gate structures will be formed. And since the dummy gate structures 200 will be replaced by functional gate structures 320 later, the polysilicon regions 420-423 correspond to the gate components of FinFET transistors. The OD mandrels 430A/B-436A/B will be used to define the fin structures discussed above with reference to FIG. 2. For example, spacers may be formed on opposite sides (in the Y-direction) of each of the OD mandrels 430A/B-436A/B, and these spacers may be used later to define the fin structures (e.g., the fin structures 150 discussed above with reference to FIG. 2). As such, each OD mandrel can be used to define two fin structures. The details of using the OD mandrels to form the fin structures are discussed in greater detail in U.S. Pat. No. 8,881,084, filed on May 14, 2010, entitled "FinFET Boundary Optimization", the disclosure of which is hereby incorporated by reference in its entirety.

According to embodiments of the present disclosure, the portion of the IC layout 400 may include ESD FinFET transistor. For example, the region 421 may be considered a gate component of the ESD FinFET transistor (or where the gate will be formed eventually), the portion of the active region 410 left of the region 421 may be considered a source region of the ESD FinFET transistor, and the portion of the active region 410 right of the region 421 may be considered a drain region of the ESD FinFET transistor. To facilitate the ensuing discussions, the source region of the ESD FinFET transistor is labeled herein as a source region 450, and the drain region of the ESD FinFET transistor is labeled herein as a drain region 460.

The source region 450 has a dimension 470 spanning (or being measured in) the X-direction, and the drain region 460 has a dimension 480 spanning the X-direction. These dimensions 470 and 480 may also be referred to as lengths of the source region 450 and the drain region 460, respectively. Note that the dimension 470 also corresponds to a "poly-to-poly" spacing (the distance separating adjacent gate structures in the source region, and the dimension also corresponds to a "poly-to-poly" spacing in the drain region.

As is shown in FIG. 3, the dimension 480 of the drain region 460 is substantially longer than the dimension 470 if the source region 450. In some embodiments, the dimension 480 is at least twice as long as the dimension 470. In some embodiments, a ratio of the dimension 480 and the dimension 470 exceeds 4:1, meaning that the dimension 480 is four times (or more) as long as the dimension 470. In some embodiments, the dimension 480 is in a range from 0.3 microns to 0.6 microns.

As discussed above, the significantly longer drain 460 may lead to epi-growth problems (and metal contact landing problems later) if an ESD FinFET is formed according to conventional processes. For example, according to conventional ESD FinFET fabrication, the OD mandrels 430A and 430B would be formed as a single continuous OD mandrel, and the same is true for the other mandrels 431A-431B, 432A-432B, 433A-433B, 434A-434B, 435A-435B, and 436A-436B. In comparison, whereas convention ESD FinFET fabrication would have defined continuous OD mandrel across the entirety of the drain region, the present disclosure "breaks" each of the OD mandrels in the drain region 460 into two separate segments. For example, a single OD mandrel is "broken" into the OD mandrel 431A and the OD mandrel 431B, another OD mandrel is "broken" into the OD mandrel 432A and the OD mandrel 432B, yet another OD mandrel is "broken" into the OD mandrel 433A and the OD mandrel 433B, so on and so forth.

A gap 490 (denoted by dashed lines) now exists between the separated OD mandrels 431A-431B, 432A-432B, etc. Similar gaps also separate the separated mandrels 430A-430B and 436A-436B, though the boundaries for these gaps are not specifically illustrated herein. These gaps may also be viewed as extensions of the gap 490. The gap 490 may be viewed as a region where mandrels are absent. As will be discussed in greater detail below, the gap 490 in the drain region is formed so as to prevent fin structures from being formed in the portion of the drain region 460 corresponding to the gap 490. The absence of fin structures in the drain region 460 will improve epitaxial growth of the drain, which will reduce metal contact landing problems in the drain. To ensure that the fin structures will be absent in a meaningful part of the drain region 460 (e.g., in terms of dimension and/or location), the gap 490 has a lateral dimension (measured in the X-direction) 495 that is carefully configured to be not too big or too small. In some embodiments, the lateral dimension 495 is in a range from 0.1 microns to 0.25 microns in some embodiments.

In some embodiments, the breaking up of the OD mandrels may be done at the IC layout level. In other words, an initial design layout may include continuous mandrels that span the source region 450 and the drain region 460 in the X direction. This initial layout is modified or revised so that the continuous mandrels (in the layout) are broken into separate pieces in the drain region 460. As such, the subsequently-formed structures (e.g., OD mandrels) will be broken up in the manner as specified by the revised layout. The breaking up of the OD mandrels promotes better epitaxial growth in the drain region 460 and therefore allows for better metal contact landing in the drain, as discussed in greater detail below.

To facilitate the subsequent discussions of the present disclosure, a cross-sectional view of the ESD FinFET device is taken along a segment of the cutline Y1-Y1' in the source region 450, and another cross-sectional view of the ESD FinFET device is taken along a segment of the cutline Y2-Y2' in the drain region 460. FIGS. 4A-10A and 12A-13A are a series of cross-sectional drawings illustrating the fabrication processes performed in a part of the source region 450 (partially along the cutline Y1-Y1'), and FIGS. 4B-10B and 12B-13B are a series of cross-sectional drawings illustrating the fabrication processes performed in a part of the drain region 460 (partially along the cutline Y2-Y2'), according to an embodiment of the present disclosure.

Figure 4B:
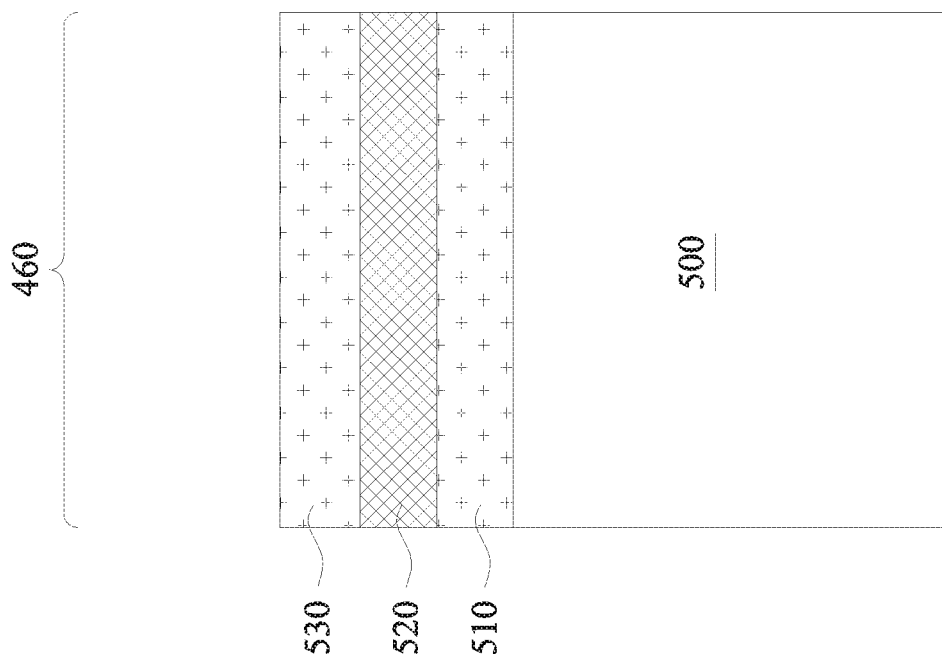
Figure 4A:
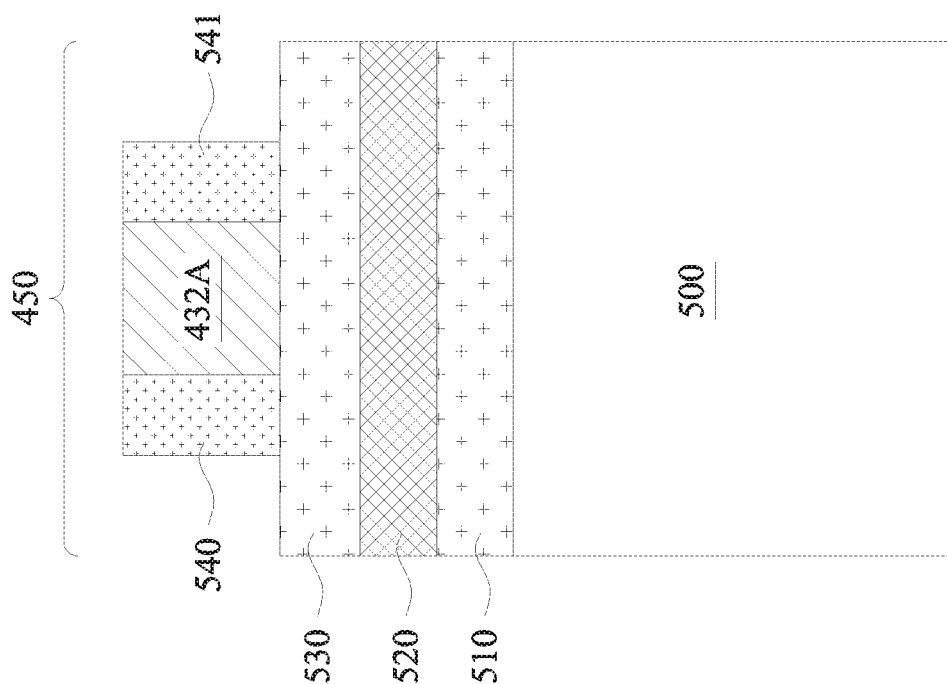

Referring to FIGS. 4A-4B, the portion of the source region 450 and the drain region 460 shown herein each include a semiconductor layer 500. The semiconductor layer 500 is an embodiment of the semiconductor layer 110 discussed above. A pad oxide layer 510 is formed over the semiconductor layer 500. The pad oxide layer 510 contains silicon oxide. A dielectric layer 520 is formed over the pad oxide layer 510, and another dielectric layer 530 is formed over the dielectric layer 520. The dielectric layers 520 may contain silicon nitride, silicon oxide, or silicon oxynitride, or combinations thereof. The dielectric layers 520-530 may collectively (or in conjunction with the pad oxide layer 510) serve as a hard mask that will be patterned to define fin structures.

As an example, FIG. 4A also illustrates one of the mandrels 432A (also shown in FIG. 3). It is understood that the other mandrels 431A and 433A are disposed on either side of the mandrel 432A. Though these mandrels (and other mandrels) are not specifically illustrated herein for space considerations and for the sake of simplicity, it is understood that the discussions below using the mandrel 432 as an example also applies to the mandrels 431A and 433A. Also, since FIG. 4B corresponds to the cross-sectional view taken along Y2-Y2', where the mandrels are broken up (and thus not present), no mandrels are disposed on the dielectric layer 530 in FIG. 4B. Thus, it may be said that according to the embodiments of the present disclosure, although mandrels are formed in the source region 450 of the ESD FinFET, at least a portion of the drain region 460 of the ESD FinFET have no mandrels formed therein.

Spacers 540-541 are formed on opposite sides of the mandrel 432A. In FIG. 4A, the spacers 540-541 are formed on the "left" and "right" side of the mandrel 432A, and thus they would correspond to being formed on the "top" side and the "bottom" side of the mandrel 432A in the top view of FIG. 3. In some embodiments, respective spacers are formed on each of the mandrels 430A-436A. In some embodiments, the spacers 540-541 contain a suitable dielectric material having a sufficient etching selectivity with the mandrel 432A.

Figure 5B:
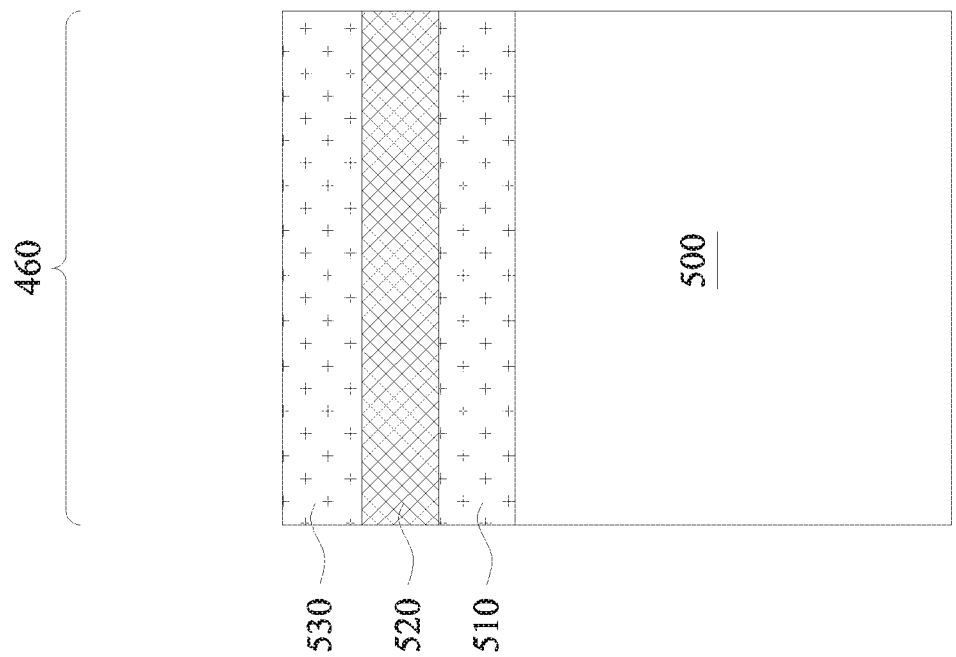
Figure 5A:
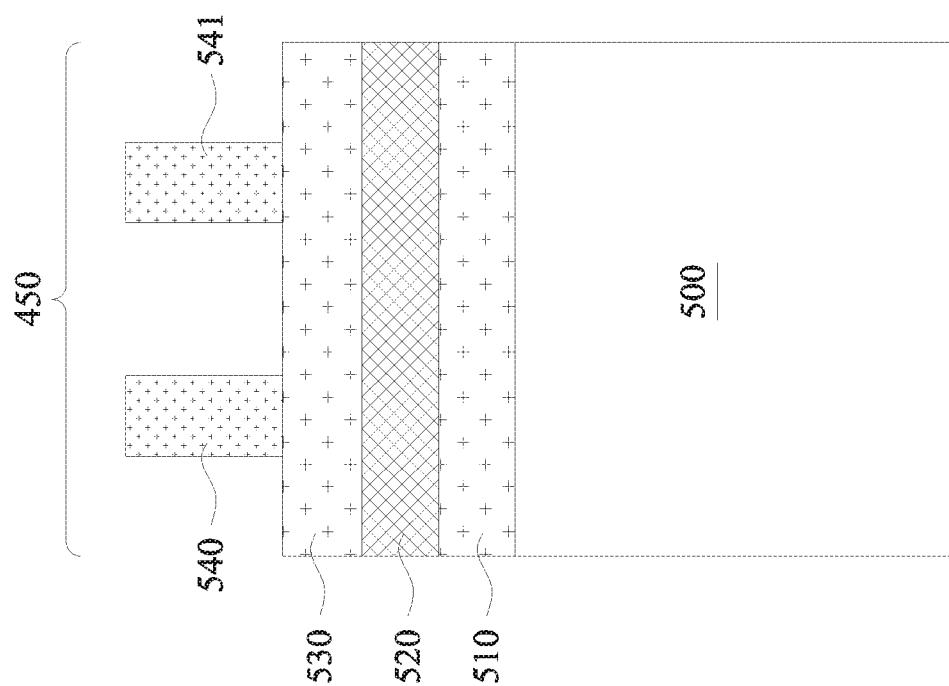

Referring now to FIGS. 5A-5B, the mandrel 432A is removed, for example through an etching process. The spacers 540-541 still remain and will be used to define (or pattern) the fin structures of the FinFET. Again, since no mandrel is formed in the portion of the drain region 460 shown in FIG. 4B, no spacers are formed in FIG. 4B either.

Referring now to FIGS. 6A-6B, the spacers 540-541 are used to pattern the layers below, via one or more etching processes, to define fin structures 550A and 550B in the source region 450. This step may also be referred to as "crown etching", and it may be similar to the process discussed above with reference to FIG. 3. In other words, portions of the semiconductor layer 500 are etched away, and some remaining portions of the semiconductor layer 500 now protrude upwardly out of the rest of the semiconductor layer. In FIG. 6B, since no spacers are formed there, no fin structures are formed either. However, a portion of the semiconductor layer 500 is also etched away in FIG. 6B, as is the case in FIG. 6A.

Referring now to FIGS. 7A-7B, a photoresist layer 600 is formed in both the source region 450 and the drain region 460. In the source region 450, the photoresist layer 600 is formed over and covers up (protects) the fin structures 550A-550B while exposing some portions of the semiconductor layer 500. These exposed portions of the semiconductor layer 500 may be etched layer so that dielectric isolation structures (such as STI) may be formed in place thereof.

Referring now to FIGS. 8A-8B, the exposed portions of the semiconductor layer 500 are etched in both the source region 450 and the drain region 460. Thereafter, the photoresist layer 600 is removed.

Figure 9B:
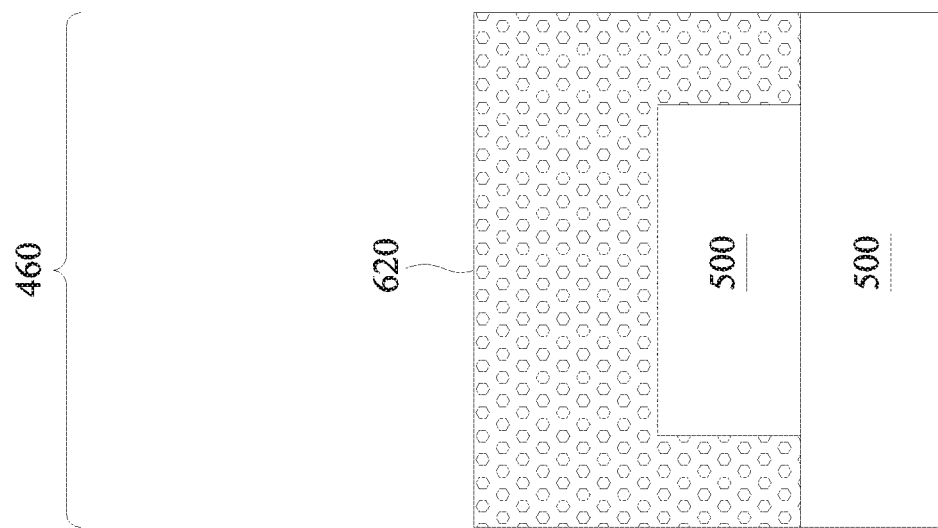
Figure 9A:
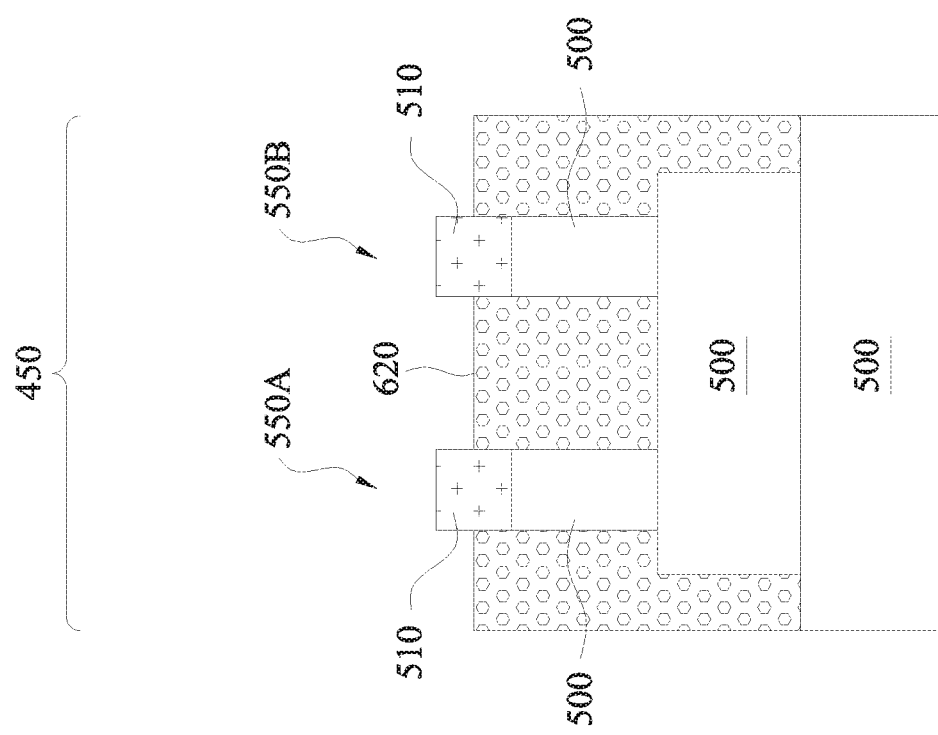

Referring now to FIGS. 9A-9B, the remaining portions of the layers 520-530 are removed, and a dielectric material 620 is formed in the source region 450 and the drain region 460. A polishing process such as chemical mechanical polishing (CMP) may be performed thereafter to planarize the upper surface of the dielectric layer 620.

The dielectric material 620 will be etched subsequently to form the dielectric isolation structures such as STIs in both the source and drain regions 450-460. However, as shown in FIGS. 9A-9B, the dielectric material 620 in the drain region 460 is wider than the dielectric material 620 in the source region 450. This is because the dielectric material 620 in the source region 450 is interrupted by the fin structures 550A-550B. Thus, the dielectric material 620 in the source region 450 is divided into several smaller blocks, whereas the dielectric material 620 in the drain region 460 is a continuous and long piece. If an etching process is performed to the dielectric material 620, the dielectric material 620 in the source region 450 may be more easily removed (since they are smaller pieces), but the dielectric material 620 in the drain region 460 may be more difficult to remove completely. An incomplete removal of the dielectric material (over the portions of the semiconductor layer 500 where epi-layers are to be grown in a subsequent process) may lead to poor quality epitaxial growth.

Therefore, the present disclosure also performs a treating step to a portion of the dielectric layer 620 in the drain region 460, so as to enhance its etching rate. Referring now to FIGS. 10A-10B, a patterned photoresist layer 650 is formed over the dielectric layer 620 in the drain region 460 (but not necessarily in the source region 450). The patterned photoresist layer 650 includes an opening 670 that exposes a portion of the dielectric layer 620 in the drain region 460. An implantation process 680 is performed through the opening 670 to implant ions into the exposed portions of the dielectric layer 620 in the drain region 460. The implantation process 680 increases the etching rate of the implanted dielectric layer 620 in the subsequent dielectric layer etching process. This will aid in the removal of the dielectric layer 620 over the portions of the semiconductor layer 500 where the drain is epitaxially grown.

Figure 11:
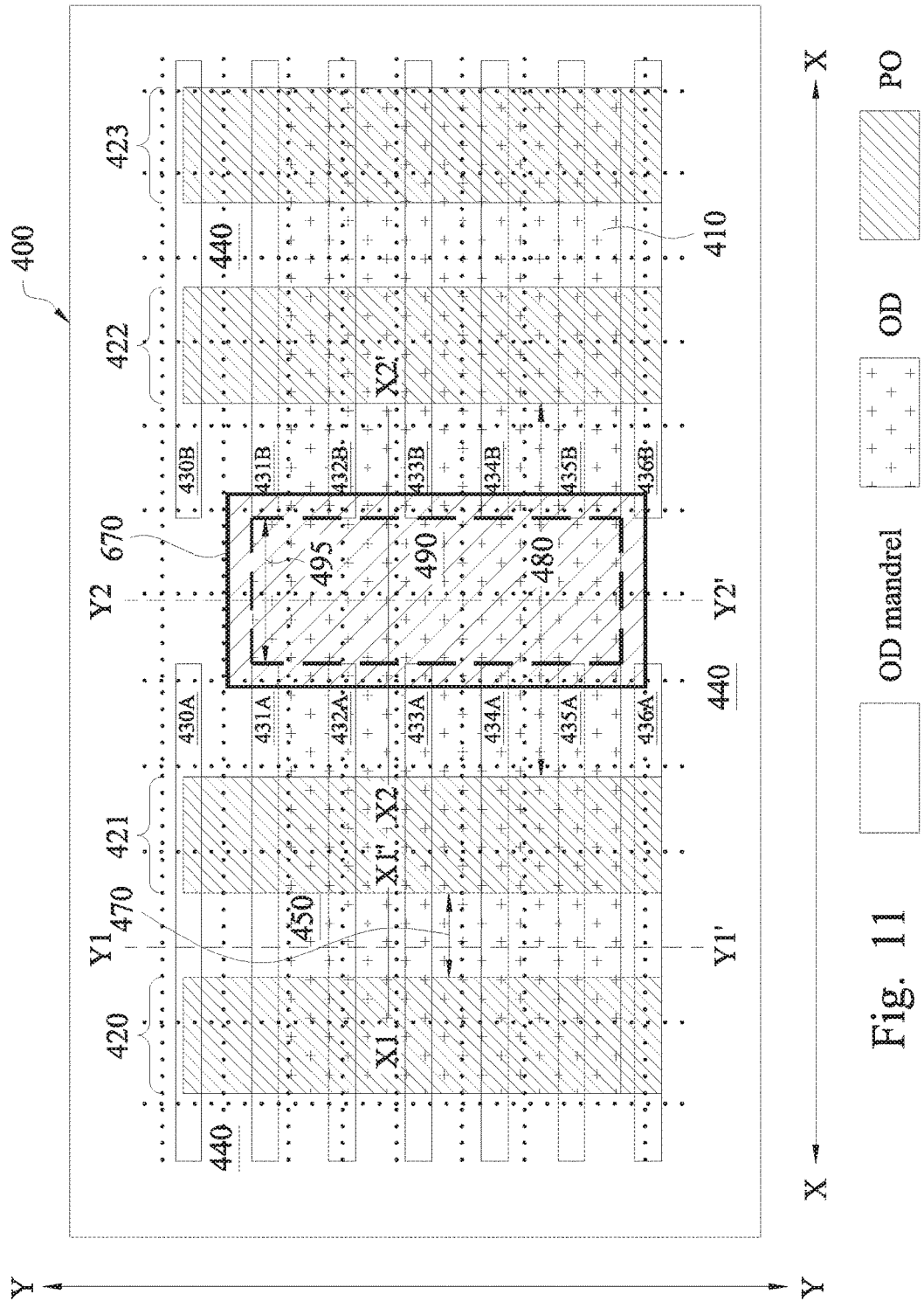
FIG. 11 is a top view of a FinFET device according to embodiments of the present disclosure.
Figure 12:
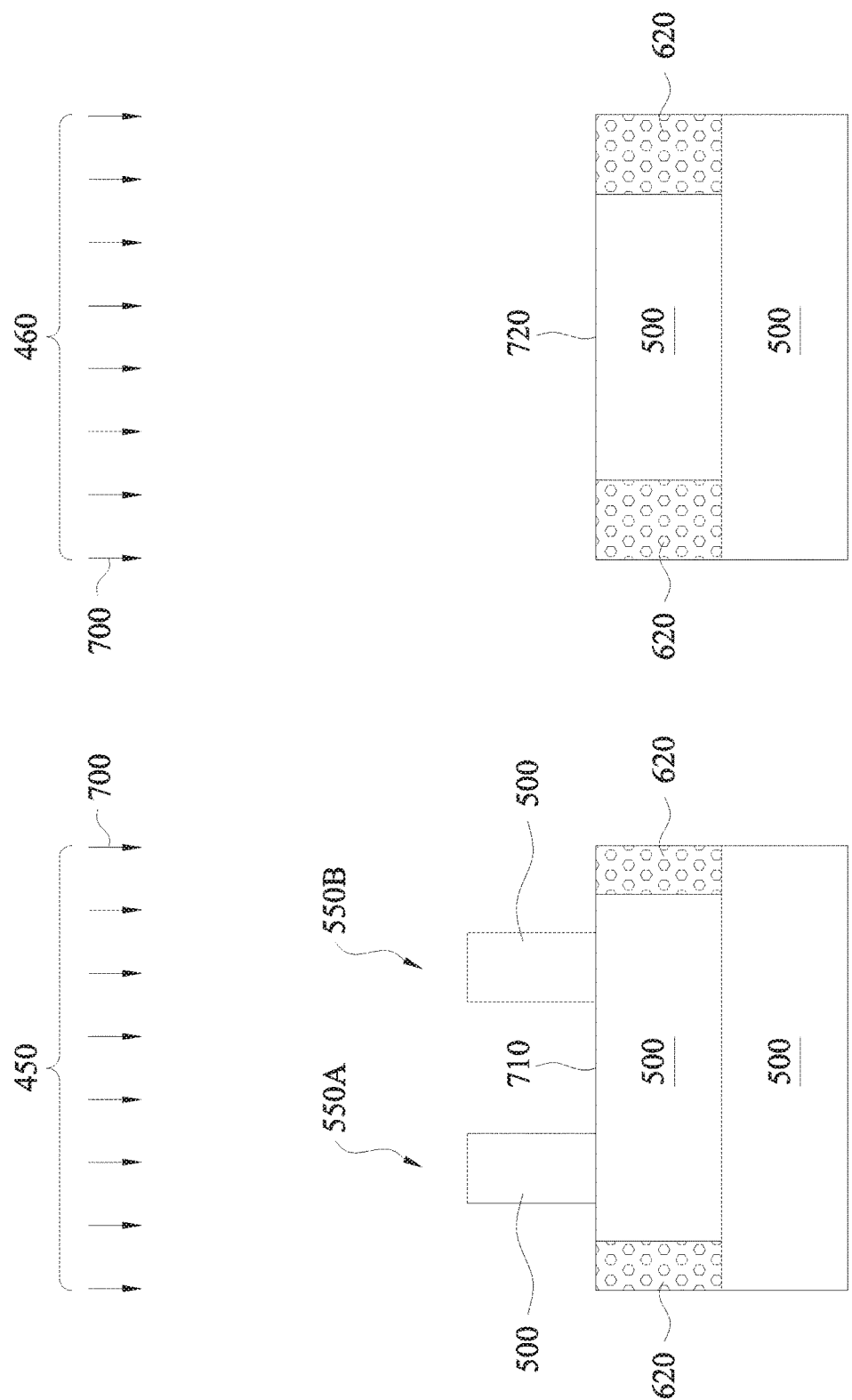
Figure 13:
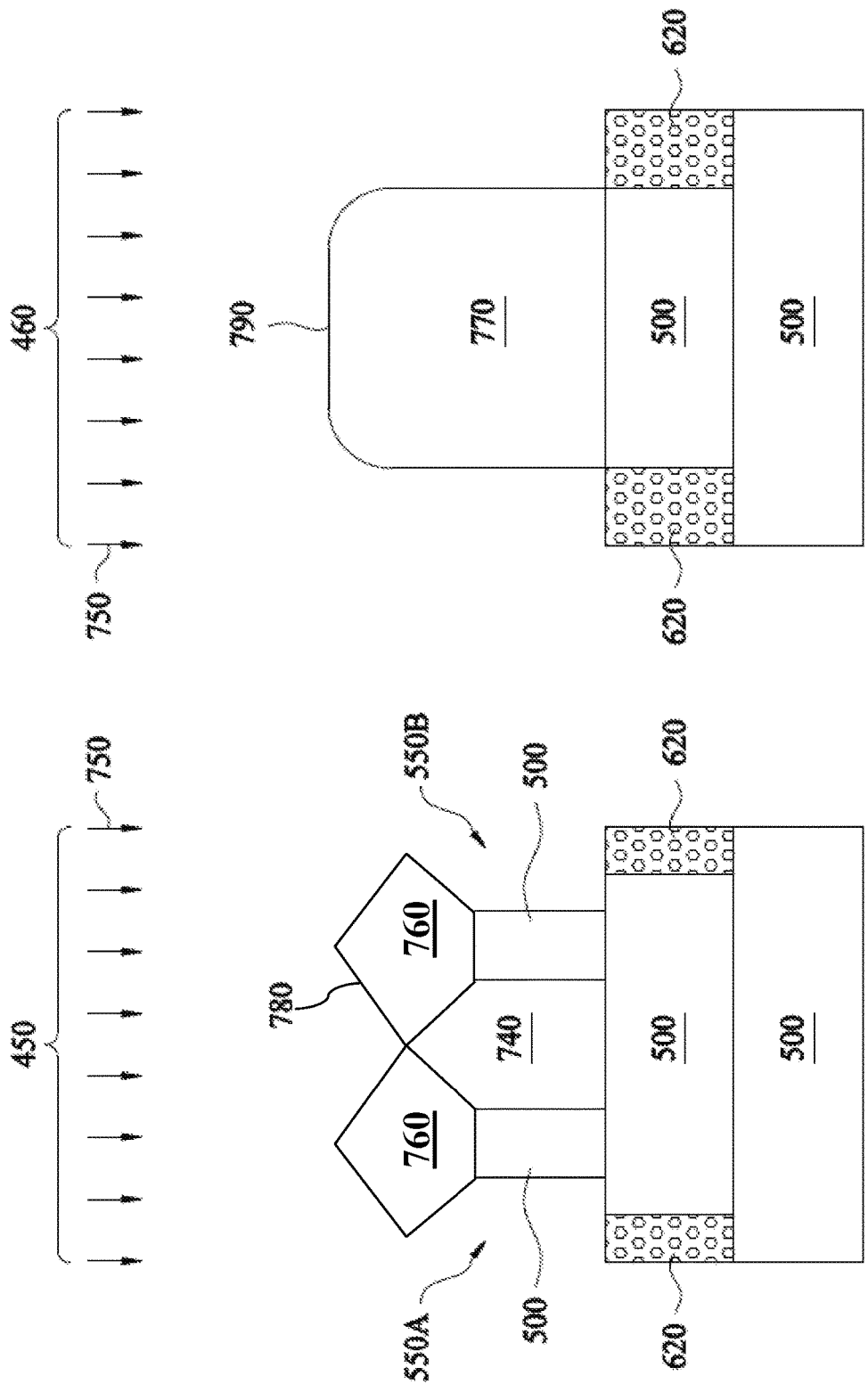
Figure 14:
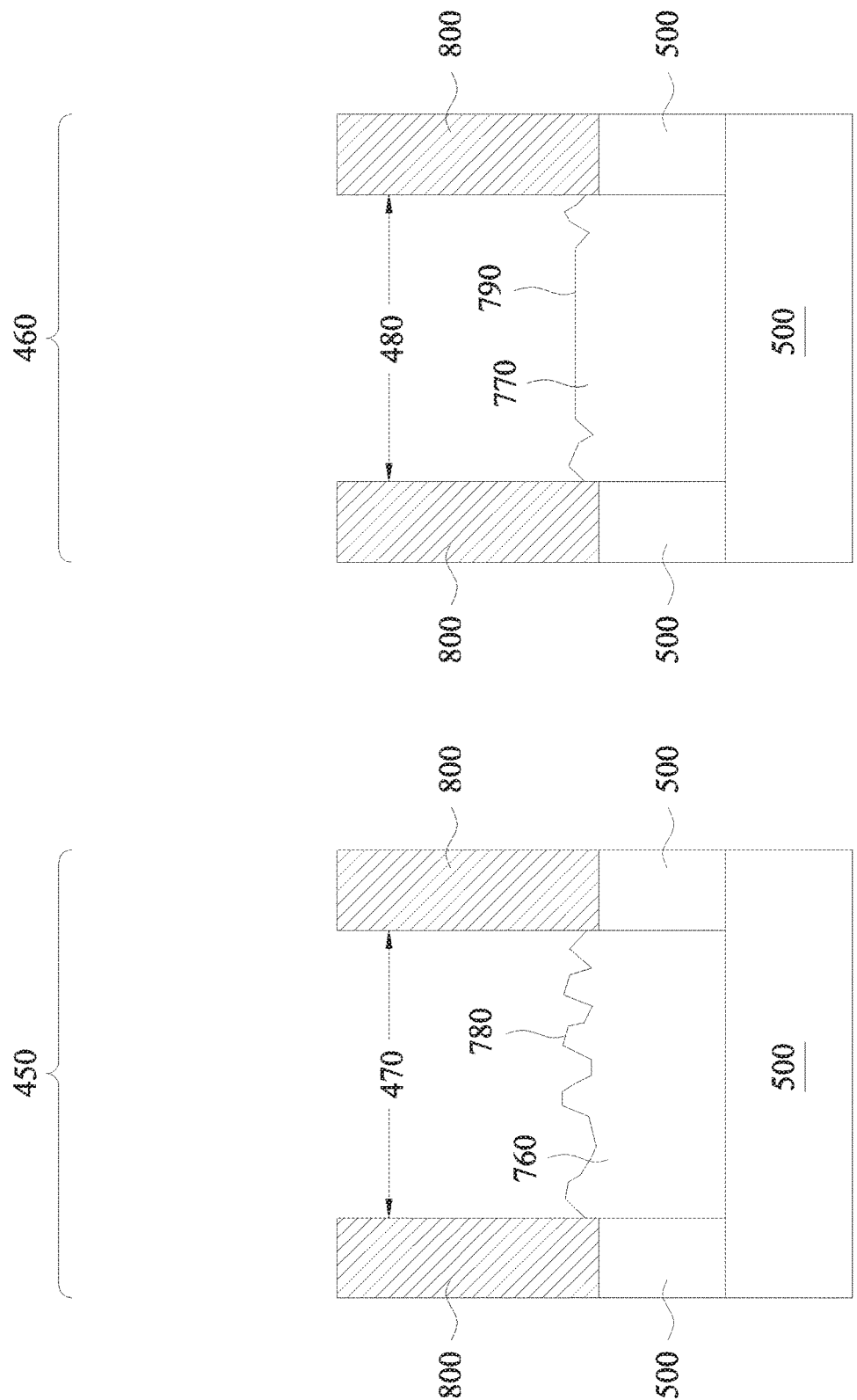
Figure 15:
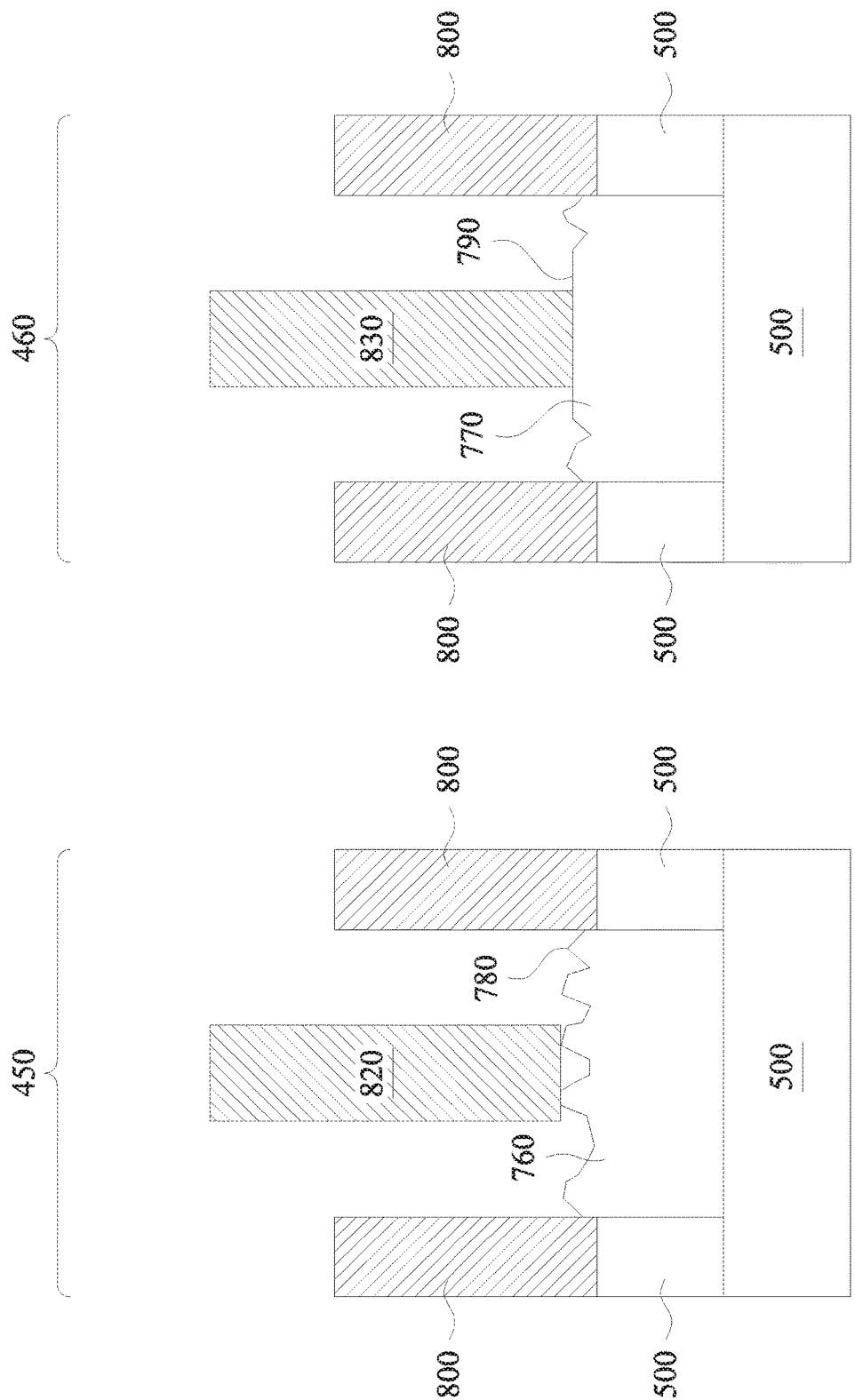

FIG. 11 is provided to more clearly show the location of the opening 670 of the patterned photoresist layer 650. In more detail, FIG. 11 is a top view of the portion of an IC layout 400, similar to that shown in FIG. 3. The same elements appearing in both FIGS. 3 and 10 are labeled the same for reasons of clarity and consistency. For reasons of simplicity, rather than showing the patterned photoresist layer 650 in this top view, the boundaries of the opening 670 formed by the photoresist layer 650 is shown. As is shown in FIG. 11, the boundaries of the opening 670 are greater than, and circumferentially surround, the gap 490. In other words, the gap 490 (corresponding to a portion of the drain region 460 where no fin structures are formed) overlaps with the opening 670, though the dimensions of the gap 490 in both the X and Y directions are smaller than those of the opening 670. It is understood that in order to ensures the clean removal of the dielectric layer 620 that are disposed over the semiconductor layer 500 where the drain is supposed to be epitaxially grown, the opening 670 only needs to be as big as the gap 490. However, the opening 670 is configured to be slightly bigger than the gap 490 so as to offer a more relaxed process window, so that if the location of the opening 670 shifts slightly, it will still expose all of the gap 490.

Note that if the patterned photoresist layer 650 wasn't formed at all, but the implantation process 680 is still performed, that may implant ions into portions of the dielectric layer 620 that eventually form the dielectric isolation structure (e.g., STI). Having ions in the dielectric isolation structure may not be desirable, as that may adversely impact the dielectric isolation structure's ability to serve as barriers for electricity. Thus, in some embodiments, a patterned photoresist layer may also be formed in portions of the source region 450 to block the ions from being implanted into certain portions of the dielectric layer 620 as well.

Referring now to FIGS. 12A-12B, the patterned photoresist layer 650 is removed. An etching process 700 is performed to etch the dielectric layer 620 until the fin structures 550A-550B are exposed, and the upper surfaces 710-720 of the semiconductor layer 500 are exposed in both the source region 450 and the drain region 460, respectively. As discussed above, the upper surfaces 710-720 need to be clean in order to ensure good epitaxial growth to form the source and drain of the FinFET. Thus, the dielectric layer 620 disposed over the upper surfaces 710-720 should be thoroughly removed. Due to the long dimension of the drain region 460, this would have been difficult without enhancing the etching rate of the dielectric layer 620. However, since the implantation process 680 is performed through the opening 670 (FIG. 10B) to enhance the etching rate of the exposed dielectric layer 620, portions of the dielectric layer 620 can be thoroughly and cleanly removed during the etching process 700, thereby leaving clean exposed upper surfaces 710-720 for the semiconductor layers 500 in the source region 450 and the drain region 460. Dielectric isolation structures (e.g., STIs) are formed by the remaining portions of the dielectric layer 620.

At this stage of fabrication, the fin structures are exposed, and the STIs are formed. A plurality of other processes is also performed to form the source and drain of the FinFET. Since these processes (such as formation of the gate) have already been discussed above, they will not be repeated again herein.

Referring now to FIGS. 13A-13B, an epitaxial growth process 750 is performed to epitaxially grow epi-layers 760 in the source region 450 and an epi-layer 770 in the drain region 460. Referring to FIG. 13A, the epi-layers 760 are grown on the fin structures 550A-550B, which are portions of the semiconductor layer 500 protruding upwardly out of the semiconductor layer 500. In some embodiments, each epi-layer 760 may have a cross-sectional profile (in the Y-cut shown in FIG. 13A) that resemble a diamond. In other embodiments, each epi-layer 760 may have a cross-sectional profile that resembles the source/drain epi region 290 shown in FIG. 2.

Of course, it is understood that devices fabricated in the real world may not have such a clearly defined cross-sectional profile, but it is understood that the upper surfaces 780 of the epi-layers 760 may still be "bumpy" (e.g., have rise-and-falls) and are not smooth or flat. The epi-layers 760 serve as the source component of the ESD FinFET. The fin structures 550A-550B (e.g., the protruding portions of the semiconductor layer 500) may also be considered a part of the source component.

In comparison, the epi-layer 770 in the drain region 460 has a different profile than the epi-layers 760 in the source region 450. Since the illustrated portion of the drain region 460 does not have the fin structures, the epi-layer 770 is formed on the semiconductor layer 500. As a result, the epi-layer 770 is formed to have a cross-sectional profile that more closely resembles a block or a rectangle (without the sharp 90 degree angles). Due to the performance of the implantation process 680 discussed above, and consequently the clean removal of the exposed portion of the dielectric layer, the semiconductor layer 500 (on which the epi-layer 770 is grown) has a good surface for epitaxial growth. As such, the epitaxial growth of the epi-layer 770 is enhanced.

Compared to the epi-layer 760 in the source region 450, the epi-layer 770 in the drain region 460 may also be thicker and taller. In some embodiments, the height of the epi-layer 770 exceeds the combined height of the epi-layer 760 and the fin structure 550A/B on which it is formed. In addition, since the epi-layer 770 is grown on a relatively flat surface (the surface 720 of the semiconductor layer 500, as shown in FIG. 12B), rather than on protruding fin structures, an upper surface 790 of the epi-layer 770 is flatter and/or smoother than the upper surface 780 of the epi-layers 760. It is understood, however, that the upper surface 780 of the epi-layer 790 may not be entirely flat or smooth in real world fabrication, and it may still exhibit some surface topography variations (e.g., rise-and-falls or dips). It is just that compared to the upper surface 780 of the epi-layer 760, the upper surface 790 of the epi-layer 770 has smaller topography variations.

Again, the difference in the epi-layers formed in the source region 450 and the drain region 460 is attributed to the fact that this part of the drain region 460 has no fin structures formed, which is due to the "breaking" of the mandrels as discussed above with reference to FIG. 3. Had the mandrels not been "broken", the epi-layers would also have been formed on fin structures in the drain region 460, which may then resemble the epi-layer 760 in the source region 450. However, due to the longer length of the drain region 460 compared to the source region 450 (the dimensions 480 and 470 discussed above with reference to FIG. 3), the drain region epi-layers (had they been formed on fin structures) may end up having a shorter height. This may lead to metal contact landing problems. For example, in a subsequent fabrication stage, conductive metal contacts are formed in the drain region 460 and/or the source region 450. If the epi-layer in the drain region is too short (i.e., not thick enough), the metal contact may not be in full contact with the upper surface of the epi-layer, which leads to poor electrical connections. In addition, even if some physical contact is made between the two, the physical contact may not be optimal, due to the jagged/rough upper surface of the epi-layer. This also leads to poor electrical connections. However, this is not a problem herein, because as discussed above, the epi-layer 770 formed in the drain region 460 is not formed on fin structures, and as such it can be grown to have a relatively good thickness/height and a relatively flat/smooth surface, which will allow it to make good physical contact with the metal contact.

It is also noted that another difference between the source region 450 and the drain region 460 is that the source region 450 has more air gaps than the drain region 460. In more detail, the epi-layers 760, the fin structures 550A-550B, and the semiconductor layer 500 may collectively trap an air gap 740 therein as the epi-layer 760 is grown. This is at least in part due to the laterally-protruding profile of the epi-layers 760. If two adjacent epi-layers 760 merge or come into physical contact with one another, such air gap 740 may be formed as a result. In comparison, the epi-layer 770 in the drain region is substantially free of air gaps, since it is grown on a relatively flat surface. The presence of air gaps such as the air gap 740 in the source component of the ESD FinFET may not pose a problem for metal contact landing as long as there can be good physical contact between the epi-layer 760 with the metal contact formed thereover. The difference in air gaps between the source component and the drain component is another distinguishing physical characteristic of the ESD FinFET devices formed according to the present disclosure, which may not exist in conventionally fabricated ESD FinFET devices.

The difference between the epi-layers 760 and 770 are also illustrated in FIGS. 14A-14B, which are also cross-sectional side views of the source region 450 and the drain region 460, albeit taken along the cut-lines X1-X1' and X2-X2' (along the X-direction) as shown in the top view of FIG. 3. For example, FIGS. 14A and 14B each shows portions of two adjacent gate structures 800 formed over fin structures (e.g., the semiconductor layer 500 protruding upward), which may be implemented as an embodiment of the gate structures 320 discussed above with reference to FIG. 2. For example, the gate structures 800 may include metal gate electrodes formed by a gate replacement process discussed above. The distance 470 (discussed above with reference to FIG. 3) separates the gate structures 800 in the source region 450, and the distance 480 (also discussed above with reference to FIG. 3) separates the gate structures 800 in the drain region 460. As discussed above, the distance 480 is greater than the distance 470 (e.g., at least twice as long), though this may not be readily appreciated in FIGS. 14A-14B, since FIGS. 14A and 14B are not drawn in scale.

The epi-layer 760 is formed between the two adjacent gate structures 800 in the source region 450. The epi-layer 770 is formed between the two adjacent gate structures 800 in the drain region 460. Comparing the epi-layers 760 and 770, it can be seen that the upper surface 780 of the epi-layer 760 has more rise-and-falls than the upper surface 790 of the epi-layer 770. In other words, the topography variation of the surface 790 is smaller than the topography variation of the surface 780. The flatter or smoother surface 790 provides a good contact surface for metal contacts. In some embodiments, the epi-layer 770 may also be taller or thicker than the epi-layer 760 due to the fact that the epi-layer is not grown on fin structures.

Again, had the mandrels not been broken up, and that fin structures were formed extending along the drain region 460 in its entirety, the epi-layer formed as a part of the drain would have been more similar to the epi-layer 760 in its surface characteristics. However, due to the longer length of the drain region 460, that epi-layer (formed on fin structures in the drain) may also be substantially shorter/thinner than its counterpart in the source region 450, and certainly shorter/thinner than the epi-layer 770 formed in the drain region 460 according to the embodiments discussed herein. That would have caused metal contact landing problems, as the metal contact may have difficulty coming into contact with the rough upper surface of the drain epi-layer that may also be short/thin.

Note that portions of the epi-layer 770 (near the gate structures 800) may also exhibit some unevenness in its upper surface. This is caused by the fact that the absence of the mandrels is not throughout the drain region 460. As shown in FIG. 3, though the mandrels have been broken in the drain region 460, thereby leading to an absence of mandrels (and subsequently formed fin structures) in the drain region 460, there are still some remaining segments of the mandrels in the drain region 460. In this case, the fin structures would be formed on opposite sides (top and bottom) of the remaining segments of the mandrels, and thus some parts of the epi-layer (e.g., the portions shown in FIG. 14B having the jagged upper surface) are still formed on fin structures. However, since the metal contact is supposed to be formed closer to the center or middle of the epi-layer 770, the non-flat surfaces of the epi-layer 770 close to the gate structures 800 should not present a problem.

It is understood that, if desired, the mandrels can be broken in a manner such that the drain region 460 is substantially free of mandrel segments, as long as the layout plan is revised accordingly. This would have prevented fin structures being formed in the drain region 460, and consequently the epi-layer 770 being formed in the drain region 460 would likely have a substantially flat or relatively smooth upper surface throughout, rather than just a middle portion of it being relatively flat or smooth.

It is also noted that since the cross-sectional cut is taken differently in FIGS. 14A-14B (along the Y-direction in FIG. 3) and FIGS. 13A-13B (along the X-direction in FIG. 3), the air gap 740 illustrated in FIG. 13A may not appear in FIG. 14A, because it may not be "visible" according to the cut taken.

Referring now to FIGS. 15A-15B, conductive metal contacts 820 and 830 are formed in the source region 450 and drain region 460, respectively. The metal contact 820 is formed to be in physical and electrical contact with the upper surface 780 of the epi-layer 760, and the metal contact 830 is formed to be in physical and electrical contact with the upper surface 790 of the epi-layer 770. Since the epi-layers 760 and 770 serve as parts of the source and drain components of the ESD FinFET device, the metal contacts 820 and 830 provide electrical connectivity to the source and drain components of the ESD FinFET device. As discussed above, the methods discussed herein allow the metal contact 830 to be formed with good physical and electrical connections with the epi-layer 770, which would have been a problem in conventional ESD FinFET devices due to the longer drain length.

Figure 16:
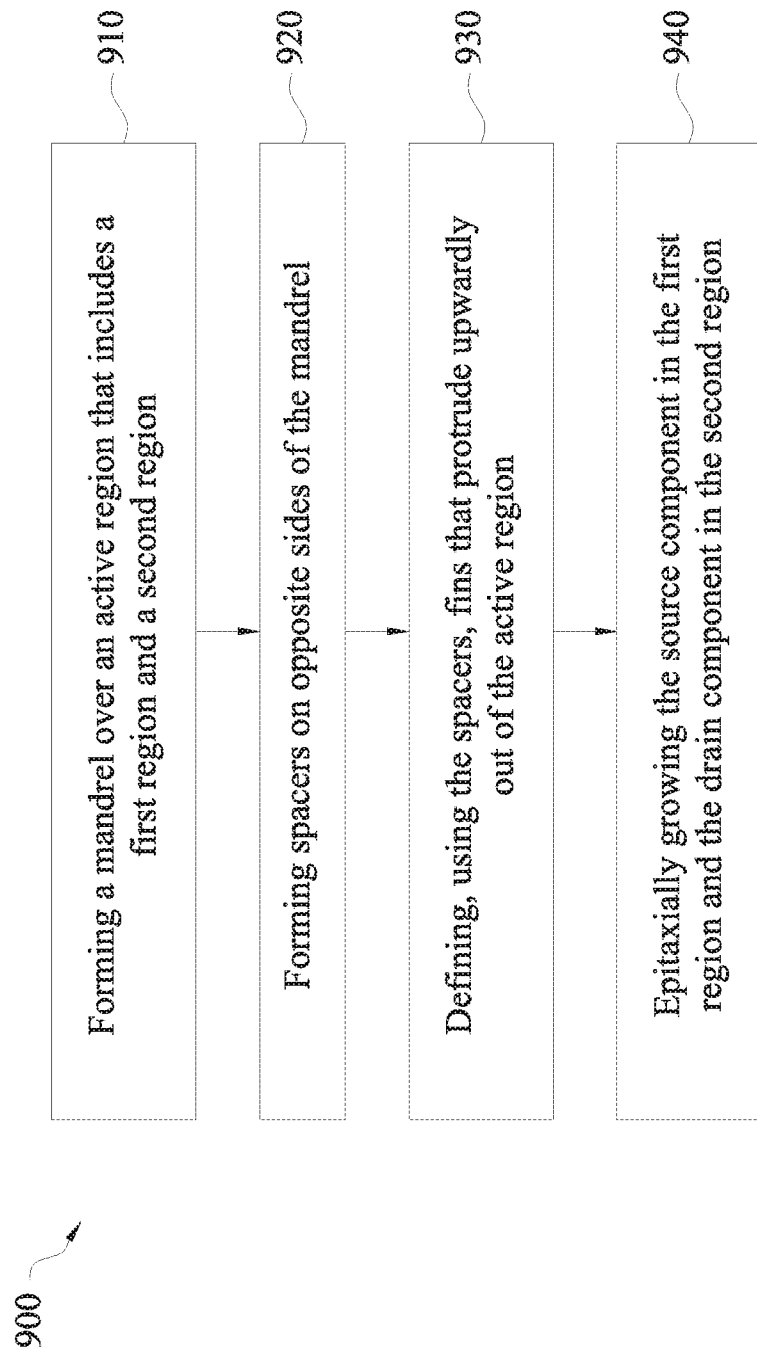
FIG. 16 is a flow chart of a method for fabricating a FinFET device in accordance with embodiments of the present disclosure.

FIG. 16 is a flowchart of a method 900 for fabricating a FinFET device in accordance with various aspects of the present disclosure. The method 900 includes a step 910 of forming a mandrel over an active region that includes a first region and a second region. The first region is reserved for a formation of a source component of a FinFET. The second region is reserved for a formation of a drain component of the FinFET. The forming the mandrel is performed such that a portion of the mandrel formed over the second region is broken up into a first segment and a second segment separated from the first segment by a gap.

The method 900 includes a step 920 of forming spacers on opposite sides of the mandrel.

The method 900 includes a step 930 of defining, using the spacers, fins that protrude upwardly out of the active region. A portion of the second region corresponding to the gap has no fins formed thereover.

The method 900 includes a step 940 of epitaxially growing the source component in the first region and the drain component in the second region. The source component is epitaxially grown on the fins in the first region. At least a portion of the drain component is epitaxially grown on the portion of the second region having no fins.

In some embodiments, the FinFET includes an electrostatic discharge (ESD) device.

In some embodiments, the second region is longer than the first region in a direction along which the mandrel extends. For example, the second region may be at least twice as long as the first region.

In some embodiments, the forming the mandrel comprises: receiving an Integrated Circuit (IC) layout plan that includes a continuous mandrel spanning the first region and the second region; and modifying the IC layout plan such that the portion of the mandrel formed over the second region is broken up into the first segment and the second segment.

In some embodiments, the epitaxially growing is performed such that the source component includes more air trapped therein than the drain component.

In some embodiments, the drain component is grown to have a smoother upper surface than the source component.

It is understood that additional process steps may be performed before, during, or after the steps 910-940 discussed above to complete the fabrication of the semiconductor device. For example, before the step 940 of epitaxially growing the source component and the drain component is performed, a dielectric layer is formed over the first region and the second region. A photoresist layer is then formed. The photoresist layer defines an opening that includes (or surrounds) the gap. An implantation process is performed through the opening to implant ions into a portion of the dielectric layer exposed by the opening. As another example, a conductive contact is formed on the portion of the drain component that is epitaxially grown on the portion of the second region having no fins. Other process steps are not discussed herein for reasons of simplicity.

Based on the above discussions, it can be seen that the present disclosure offers advantages over conventional FinFET and the fabrication thereof. It is understood, however, that other embodiments may offer additional advantages, and not all advantages are necessarily disclosed herein, and that no particular advantage is required for all embodiments. One advantage is that by breaking the mandrels in a portion of the drain region of the ESD FinFET, it prevents fin structures from being formed in that portion of the drain region. The absence of the fin structures allow the epi-layer later formed in the drain region to have flatter and smoother surfaces that it otherwise would have (e.g., compared to a drain of an ESD FinFET fabricated according to conventional processes). The epi-layer formed in the drain region may also be thicker than the epi-layer of the drain of conventional ESD FinFETs. Furthermore, the implantation process performed to the dielectric layer in the portion of the drain enhances the etching rate of the dielectric layer, which allows for a cleaner removal of the dielectric layer over a portion of a semiconductor layer where the epi-layer will be grown in the drain. Other advantages include compatibility with existing processing steps and the ease of implementation. Therefore, implementing the present disclosure will not significantly increase fabrication costs.

One aspect of the present disclosure involves a method of fabricating a semiconductor device. A mandrel is formed over an active region that includes a first region and a second region. The first region and the second region are reserved for the formation of a source and a drain of a FinFET, respectively. A portion of the mandrel formed over the second region is broken up into a first segment and a second segment separated from the first segment by a gap. Spacers are formed on opposite sides of the mandrel. Using the spacers, fins are defined. The fins protrude upwardly out of the active region. A portion of the second region corresponding to the gap has no fins formed thereover. The source is epitaxially grown on the fins in the first region. At least a portion of the drain is epitaxially grown on the portion of the second region having no fins.

Another aspect of the present disclosure involves a method of fabricating a semiconductor device. A mandrel is formed over a first region of a semiconductor layer corresponding to a source of a FinFET and over a second region of the semiconductor layer corresponding to a drain of the FinFET. The second region is longer than the first region. The mandrel formed over the first region is continuous. The mandrel formed over the second region is divided into a first segment and a second segment that is spaced apart from the first segment. At least in part using the mandrel, fin structures are formed that protrude upwardly out of the semiconductor layer. At least a part of the source of the FinFET is epitaxially grown on the fin structures in the first region. At least a part of the drain of the FinFET is epitaxially grown on the semiconductor layer in the second region.

Yet another aspect of the present disclosure involves a semiconductor device. The semiconductor device includes a gate component. A source component is disposed on a first side of the gate component. The source component includes a plurality of fin structures protruding out of a semiconductor layer and a first epi-layer grown on the fin structures. A drain component is disposed on a second side of the gate component, the second side being opposite the first side, wherein the drain component includes a second epi-layer grown on a portion of the semiconductor layer that is free of protruding fin structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first source/drain region that includes:
      a plurality of fin structures that protrude upwardly from a semiconductive layer; and
      a plurality of first epi-layers formed over the fin structures,
      wherein the first epi-layers laterally merge into one another;
   a second source/drain region that includes a second epi-layer formed directly on the semiconductive layer, wherein the second epi-layer and the first epi-layers have different side view profiles;

a first conductive contact disposed over the first epi-layers; and a second conductive contact disposed over the second epi-layer.

2. The semiconductor device of claim 1, wherein:

the first conductive contact is in direct contact with the first epi-layers; and the second conductive contact is in direct contact with the second epi-layer.

3. The semiconductor device of claim 1, wherein the first epi-layers have substantially rougher upper surfaces than the second epi-layer.

4. The semiconductor device of claim 1, wherein: the first source/drain region is a source region, and the second source/drain region is a drain region.

5. The semiconductor device of claim 1, wherein the second epi-layer is substantially taller than the first epi-layers.

6. The semiconductor device of claim 1, wherein the second source/drain region is substantially longer than the first source/drain region in a top view.

7. The semiconductor device of claim 6, wherein the second source/drain region is at least twice as long as the first source/drain region in the top view.

8. The semiconductor device of claim 1, wherein the first source/drain region, but not the second source/drain region, includes an air gap.

9. The semiconductor device of claim 1, wherein the first source/drain region and the second source/drain region are components of an Electrostatic Discharge (ESD) device.

10. The semiconductor device of claim 1, wherein the first epi-layers each have a non-flat upper surface.

11. The semiconductor device of claim 10, wherein the second epi-layer has a substantially flat upper surface.

12. A semiconductor device, comprising:

an Electrostatic Discharge (ESD) device that includes a source component and a drain component;

wherein:

the source component includes a semiconductive layer, a fin structure that protrudes vertically out of the semiconductive layer, and a first epi-layer grown on the fin structure; and the drain component includes the semiconductive layer and a second epi-layer grown directly on the semiconductive layer.

13. The semiconductor device of claim 12, further comprising:

a source contact disposed on an upper surface of the first epi-layer; and a drain contact disposed on an upper surface of the second epi-layer, wherein the upper surface of the second epi-layer is substantially smoother than the upper surface of the first epi-layer.

14. The semiconductor device of claim 12, wherein the second epi-layer has a greater vertical dimension than a combined vertical dimension of the fin structure and the first epi-layer.

15. The semiconductor device of claim 12, wherein the drain component is substantially longer than the source component in a top view.

16. The semiconductor device of claim 12, wherein the source component further includes:

a further fin structure that protrudes vertically out of the semiconductive layer; and a further first epi-layer grown on the further fin structure.

17. The semiconductor device of claim 16, wherein the first epi-layer and the further first epi-layer laterally merge into each other, thereby trapping an air gap therebelow.

18. The semiconductor device of claim 12, wherein:

the first epi-layer has an upper surface that has an upwardly protruding segment; and the second epi-layer has a substantially flat upper surface.

19. A semiconductor device, comprising:

a source region that includes a semiconductive layer, a plurality of fin structures that each protrudes vertically out of the semiconductive layer, and a plurality of first epi-layers grown on the fin structures, respectively, wherein the first epi-layers merge into each other laterally such that an air gap is formed between the semiconductive layer, the fin structures, and the first epi-layers; and a drain region that is substantially longer than the source region in a top view, wherein the drain region includes the semiconductive layer and a second epi-layer grown directly on the semiconductive layer, wherein the second epi-layer has a substantially smoother upper surface than the first epi-layers.

20. The semiconductor device of claim 19, wherein the source region and the drain region are regions of an Electrostatic Discharge (ESD) device.

* * * * *